US006251742B1

(12) United States Patent
Lin

(10) Patent No.: US 6,251,742 B1
(45) Date of Patent: Jun. 26, 2001

(54) METHOD OF MANUFACTURING A CUP-SHAPE CAPACITOR

(75) Inventor: Yeh-Sen Lin, Pa Teh (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/225,899

(22) Filed: Jan. 4, 1999

(51) Int. Cl.$^7$ .................................................. H01L 21/283

(52) U.S. Cl. ................................................................ 438/396

(58) Field of Search .................................. 438/244, 387, 438/672, FOR 220, FOR 430, 253, 396; 148/DIG. 14

(56) References Cited

U.S. PATENT DOCUMENTS

| | | |
|---|---|---|
| 4,822,753 * | 4/1989 | Pintchovski et al. . |
| 5,164,337 | 11/1992 | Ogawa et al. . |
| 5,266,513 * | 11/1993 | Fazan et al. . |
| 5,275,965 * | 1/1994 | Manning . |
| 5,518,948 | 5/1996 | Walker . |
| 5,536,673 | 7/1996 | Hong et al. . |
| 5,591,664 | 1/1997 | Wang et al. . |
| 5,595,929 | 1/1997 | Tseng . |
| 5,597,756 | 1/1997 | Fazan et al. . |
| 5,686,337 * | 11/1997 | Kohl et al. . |
| 5,856,220 * | 1/1999 | Wang et al. . |
| 6,000,411 * | 12/1999 | Lee . |

OTHER PUBLICATIONS

Sakao et al., "A Capacitor–Over–Bit–Line (COB) Cell With A Hemispherical–Grain Storage Node for 64 Mb DRAMs," *IEDM Technical Digest* 90:655–658 (1990).

* cited by examiner

Primary Examiner—George Fourson
Assistant Examiner—Joannie A. Garcia
(74) Attorney, Agent, or Firm—Christensen O'Connor Johnson & Kindness PLLC

(57) ABSTRACT

A dielectric layer is deposited over an etching stop layer. Then, a photoresist pattern is patterned on the dielectric layer. An anisotropical etching is performed to etch the dielectric layer by using the photoresist pattern as an etching mask to generate a slot in the dielectric layer. An isotropical etching is subsequently performed using the photoresist pattern as an etching mask. A further anisotropical etching is used to create contact holes to the substrate. Then, the photoresist pattern is stripped. A conductive layer is deposited along the surface of the etched dielectric layer and on the side walls of the contact holes. A filling material is refilled into the cup-shape cavities. The upper portion of the conductive layer is left exposed by the filling material. A selective etching step is performed to remove the upper portions of the conductive layer by using the filling material as a mask. The filling material and the etched dielectric layer are removed. Finally, a dielectric film is deposited along the surface of the first storage node and a conductive layer is deposited over the dielectric film.

20 Claims, 6 Drawing Sheets

METHOD OF MANUFACTURING A CUP-SHAPE CAPACITOR

FIELD OF THE INVENTION

The present invention relates to semiconductor capacitors, and more specifically, to a method of making a high capacitance memory cell capacitor with a cup-shape.

BACKGROUND OF THE INVENTION

In dynamic random access memory (DRAM) fabrication technology, continuous efforts are being undertaken to manufacture a capacitor having larger capacitance in a smaller area. Generally, a DRAM cell includes a capacitor and a transistor, the capacitor utilized for storing electric charge, and the transistor used for accessing the charge stored in the capacitor. Either the source or drain of the transistor is connected to one terminal of the capacitor. The other terminal of the transistor and the transistor gate electrode are connected to external connection lines called a bit line and a word line, respectively.

The capacitor type that is most typically used in DRAM memory cells are planar capacitors, which are relatively simple to manufacture. With the advent of ultra large scale integrated (ULSI) DRAM devices, the sizes of memory cells has gotten smaller and smaller such that the area available for a single memory cell has become very small.

For very small memory cells, planar capacitors become very difficult to use reliably. Similarly, the size of the charge capable of being stored by the capacitor decreases. This results in the capacitor being very susceptible to alpha particle radiation. Additionally, as the capacitance decreases, the charge held by the storage capacitor must be refreshed often. Therefore, a variety of methods of forming capacitors have been proposed to overcome the aforesaid problems. For a stacked memory cell, Ogawa has proposed a memory cell with a crown shape having fins formed therein, entitled "METHOD OF FABRICATING A SEMICONDUCTOR DEVICE HAVING A CAPACITOR IN A STACKED MEMORY CELL", U.S. Pat. No. 5,164,337. The method can provides a capacitor with larger surface area; however, it is relatively complicated to form a capacitor with fin structures.

A further prior art approaches to overcome these problems has resulted in the development of a capacitor-over-bit-line (COB) cell with a hemispherical-grain (HSG) polysilicon storage node (see "A CAPACITOR-OVER-BIT-LINE CELL WITH HEMISPHERICAL-GRAIN STORAGE NODE FOR 64 Mb DRAMs", M. Sakao etc. Microelectronics Research Laboratories, NEC Corporation). The HSG-Si is deposited by low pressure chemical vapor deposition at the transition temperature from amorphous-Si to polycrystalline-Si. Conventional methods of increasing area by using HSG is insufficient. If the HSG-Si storage node is compared with a planar node, the increase of the surface area of the node is up to about two at best.

SUMMARY OF THE INVENTION

A method for manufacturing an integrated circuit capacitor is disclosed. The method comprises the steps of: forming an etching stop layer over a semiconductor substrate; forming a dielectric layer on said etching stop layer, wherein said dielectric layer has a higher etching selectivity to said etching stop layer; patterning a photoresist on said dielectric layer; anisotropically etching said dielectric layer by using said photoresist as an etching mask, thereby generating a slot in said dielectric layer; isotropically etching said dielectric layer by using said photoresist as an etching mask, thereby expanding said slot to form a cup-shape cavity in said dielectric layer; stripping said photoresist; forming a first conductive layer along a surface of said etched dielectric layer; filling material into said cup-shape cavity, wherein an upper portion of said first conductive layer is left exposed by said material; removing the exposed upper portion of said first conductive layer using said material as a mask; removing said etched dielectric layer and said material to generate a conductive cup-shape structure; forming a dielectric film on said conductive cup-shape structure; and forming a second conductive layer over said dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a capacitor for a DRAM cell having improved capacitance. Further, the present invention uses high etching selectivity between oxide, such as BPSG (borophosphosilicate glass), CVD silicon dioxide and polysilicon to form a novel cup-shape structure. Further, the present invention uses two steps of etching including an isotropic etching and an anisotropic etching to create the aforementioned structure. As will be seen below, this technique can be used to form a cup-shape capacitor with larger surface area.

Figure 1:
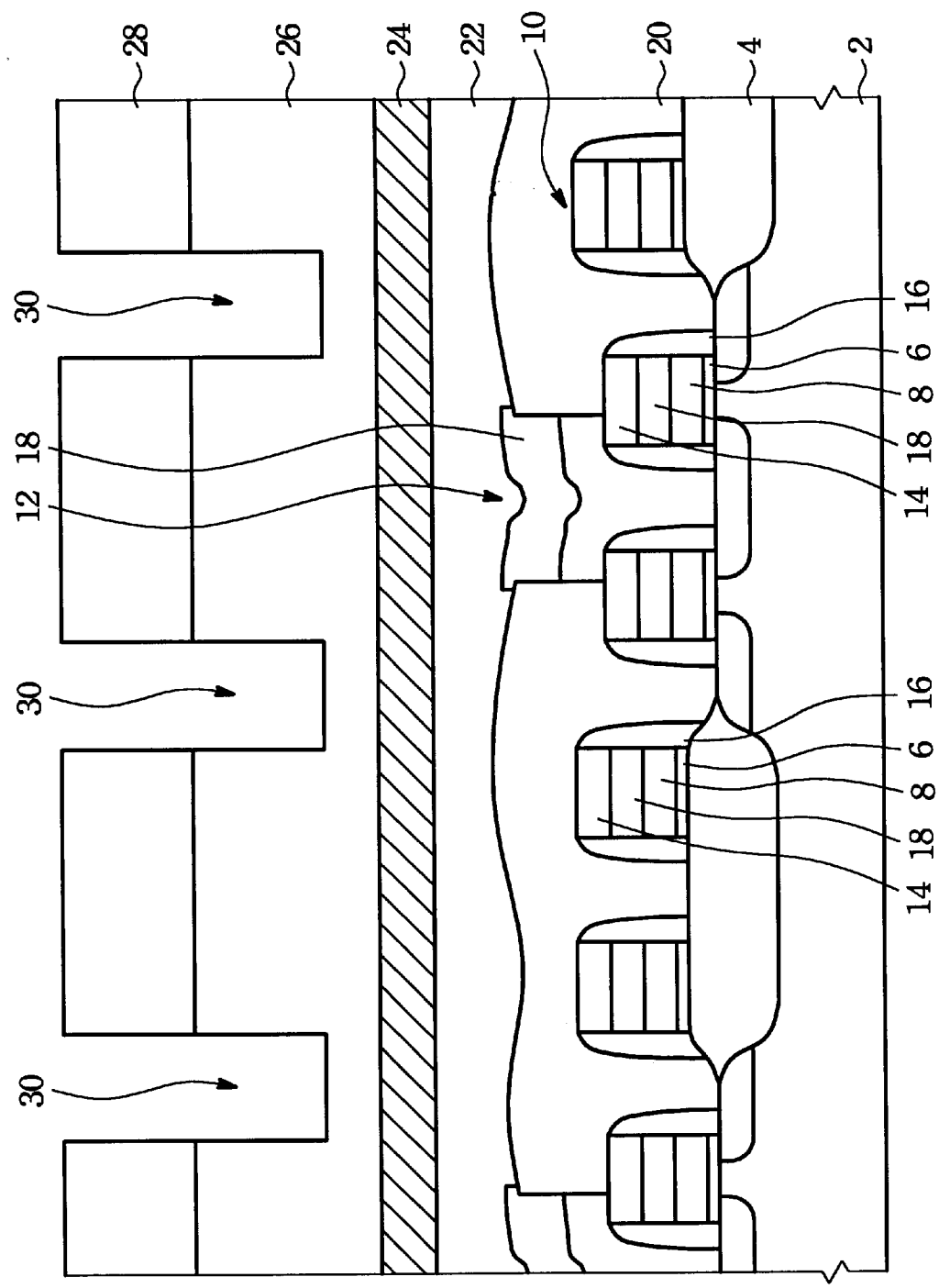
FIG. 1 is a cross section view of a semiconductor wafer illustrating the steps of forming a gate structure and a plurality of slots in a dielectric layer.

Referring to FIG. 1, a single crystal P-type substrate 2 with a <100> crystallographic orientation is used for the preferred embodiment. A thick field oxide region (FOX) 4, is created for the purposes of isolation. Generally speaking, the FOX 4 region is created via photolithography and dry etching steps to etch a silicon nitride-silicon dioxide composite layer. After the photoresist is removed and wet cleaned, a thermal oxidation in an oxygen-steam ambient is used to form the FOX 4 region, to a thickness of about 3000–8000 angstroms. As known in the art, other techniques such as trench isolation can also be used to form as the isolation.

Initially, a silicon dioxide layer 6 is created atop the substrate 2 to use as a gate oxide. In the preferred embodiment, the silicon dioxide layer 6 is formed by using an oxygen-steam ambient, at a temperature between about 800 to 1100° C. Alternatively, the gate oxide 6 may be formed using other known oxide chemical compositions and procedures. As is known in the art, the silicon dioxide layer 6 can be formed by using chemical vapor deposition (CVD) process, using TEOS (tetraethylorthosilicate) as a source at a temperature between about 600 to 800° C., at a pressure of 1 to 10 torrs. In the preferred embodiment, the thickness of the silicon dioxide layer 6 is approximately 30–300 angstroms. Other thickness may be used depending on the application.

Still referring to FIG. 1, after the first silicon dioxide layer 6 is formed, a first polysilicon layer 8 is formed over the silicon dioxide layer 6 and the field oxide regions 4. In the preferred embodiment, the first polysilicon layer 8 is formed by using conventional chemical vapor deposition (CVD) to have a thickness of about 500–3000 angstroms. Then, a word line 10, a bit line 12, gate structures with cap layer 14, and side wall spacers 16 are formed using well known technology. The gate electrode 8, the bit line 12, and the word line 10 can comprise metal silicide layer 18 formed thereon to reduce their resistance. All of aforesaid items are not particularly germane to the present invention. Thus, only a cursory description of the formation of a gate structure is given here.

A dielectric layer 20 or dual dielectric layers 20, 22 for isolation purposes is (are) formed on the gate structures, FOX 4 and substrate 2 to a thickness of about 1000–10000 angstroms. The dielectric layers 20, 22 are preferably formed of oxide. An etching stop layer 24 is then formed on the dielectric layer 22. A further dielectric layer 26 is next deposited on the etching stop layer 24. The etching stop layer 24 has a relatively low etching rate to the dielectric layer 26. In an actual embodiment, in the case of selecting oxide as the dielectric layer, silicon nitride serves as the etching stop layer 24. Thus, there is high etching selectivity between the dielectric layer 26 and the etching stop layer 24.

Still referring to FIG. 1, an anisotropic etching is performed to etch the dielectric layer 26 by using a photoresist pattern 28 as an etching mask. The photoresist pattern 28 is patterned via conventional photolithography techniques. The etching step generates a plurality of slots 30 in the dielectric layer 26, and the slots 30 have almost vertical side walls due to the fact that the etching is performed by using anisotropic etching. Typically, this can be done by dry etching (plasma etching).

Figure 2:
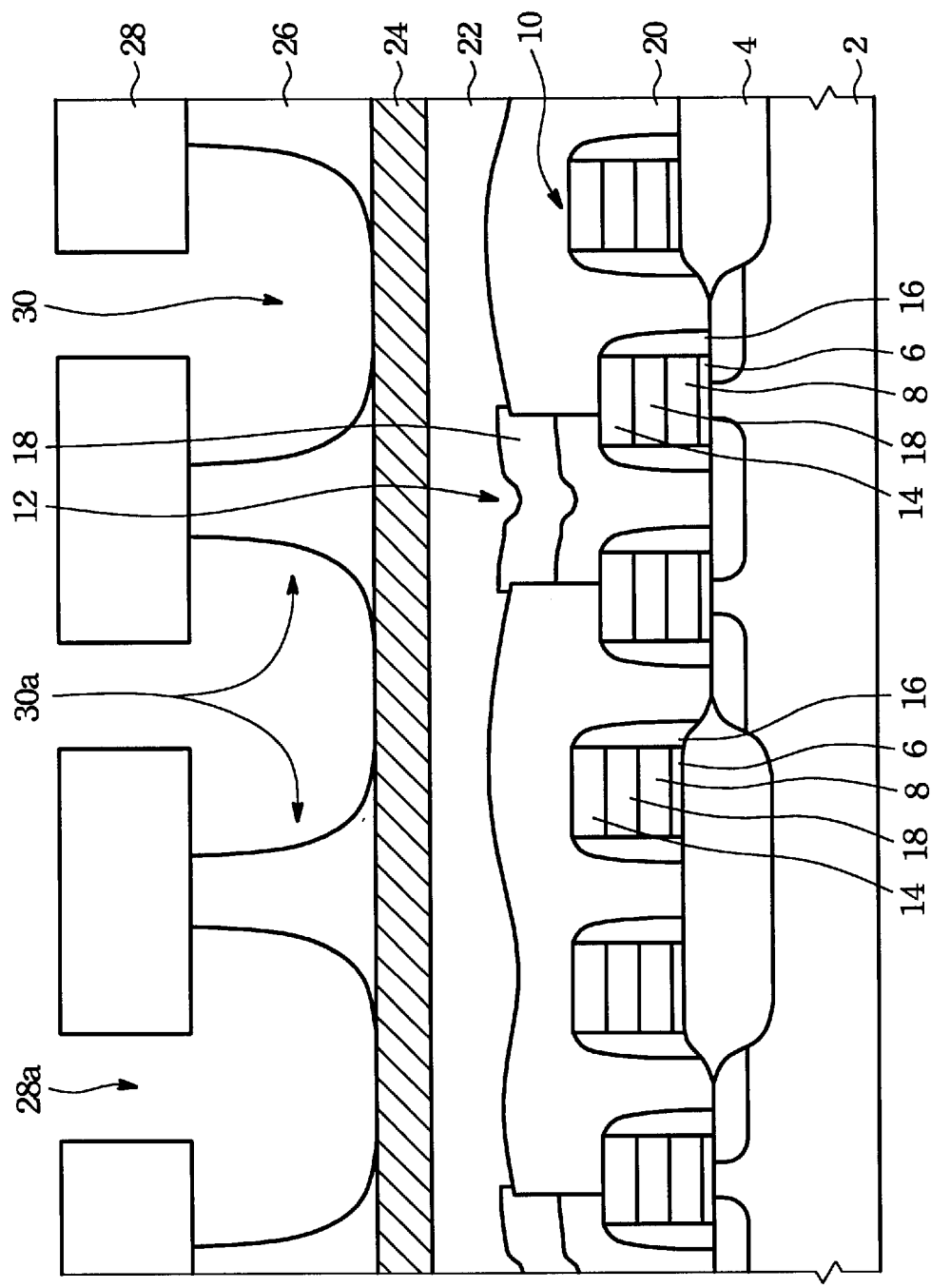
FIG. 2 is a cross section view of a semiconductor wafer illustrating the step of forming cup-shape cavities in the dielectric layer.

Referring to FIG. 2, an isotropic etching (such as wet etching) is subsequently performed prior to the removal of the photoresist pattern 28. The photoresist pattern 28 also serves as an etching mask during the etching and the etchant will isotropically attack the dielectric layer 26 through the slots 30, thereby generating undercut portions 30a under the photoresist pattern 28. Thus, the slots 30 are expanded by the isotropic etching and the expanded slots are wider than the openings 28a of the photoresist pattern 28. Preferably, the isotropic etching is performed by employing wet etching. The etchant can be selected from HF solution, HF vapor or BOE (buffer oxide etching) solution if the dielectric layer 26 is an oxide. As well known in the art, other materials and etchants can be used to achieve the purpose of highly selective etching. The susceptability of oxide to etching is also much greater than that of nitride. Therefore, the etching stops at the surface of the etching stop layer 24.

Figure 3:
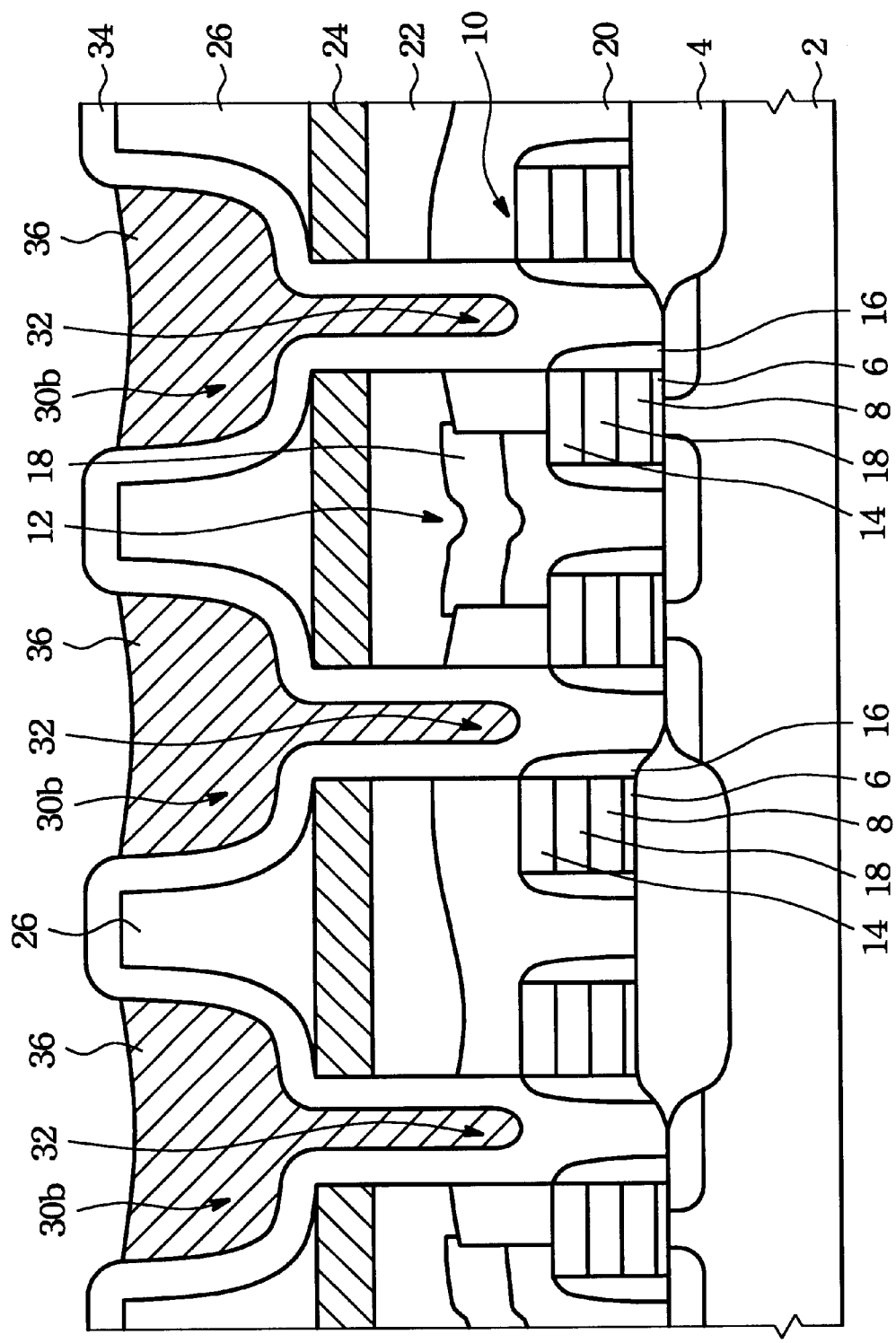
FIG. 3 is a cross section view of a semiconductor wafer illustrating the steps of forming a conductive layer and filling material in the cup-shape cavities.

Further, turning to FIG. 3, a second anisotropic etching is used to etch the layers 24, 22, and 20 by changing the recipe of the etchant to form contact holes 32 to the substrate 2, thereby exposing a portion of the source and drain regions of the transistors. The photoresist pattern 28 still also acts as mask. After the second anisotropic etching, the photoresist pattern 28 is stripped.

Still referring to FIG. 3, a second conductive layer 34 is deposited using well known processes along the surface of the etched dielectric layer, on the side walls of the contact holes 32 and on the source and drain. Moreover, the lower portion of the etched dielectric layer 26 is wider than the upper portion of the layer 26. Thus, cavities 30b in the etched dielectric layer 26 are shaped like a cup-structure. A cavity filling material 36 is refilled into the cup-like cavities 30b. Preferably, oxide, polyimide or photoresist can be used as the filling material. The upper portion of the second conductive layer 34 must be left exposed by the filling material 36. Thus, an etching may be needed after the filling material 36 is formed to remove the material covers the conductive layer 34 on the topmost portion of the etched dielectric layer 26. The second conductive layer 34 has a thickness between 300 to 1500 angstroms. The second conductive layer 34 can be chosen from doped polysilicon, in-situ doped polysilicon, aluminum, copper, tungsten, or titanium compound.

Figure 4:
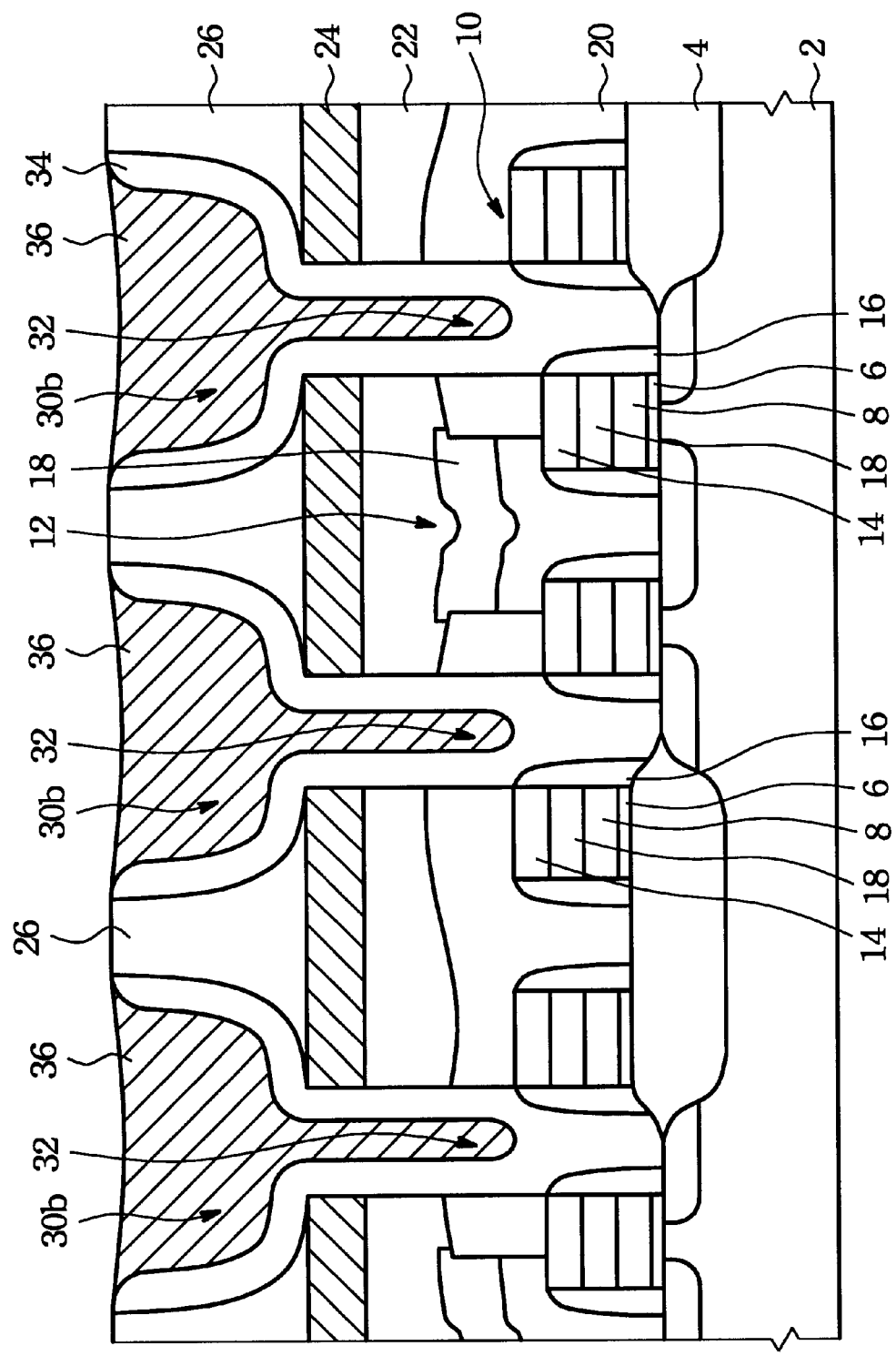
FIG. 4 is a cross section view of a semiconductor wafer illustrating the step of selectively etching the upper portion of the conductive layer.

Next, referring to FIG. 4, a selective etching step is performed. An important key of the present invention is that the susceptibility of the second conductive layer 34 to etching is much greater than that of filling material 36. A dry etching process is used to achieve this purpose. The etchant used to etch polysilicon is SiCl4/Cl2, BCl3/Cl2, HBr/Cl2/O2, HBr/O2, Br2/SF6 or SF2. The upper portions or uncovered portion of the second conductive layer 34 are removed by using the filling material 36 as a mask, and the second conductive layer 34 are separated into a plurality of individual storage nodes.

Figure 5:
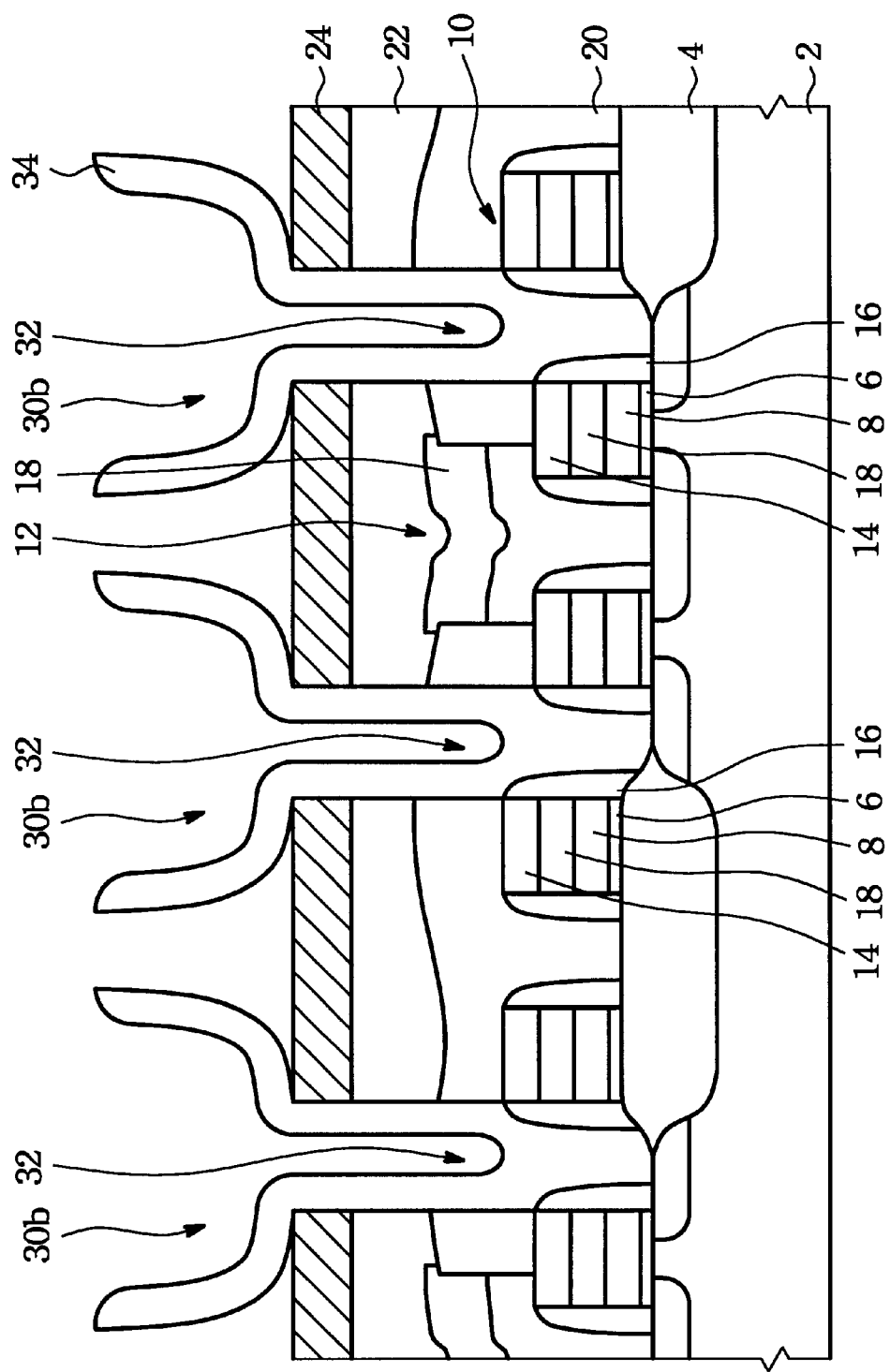
FIG. 5 is a cross section view of a semiconductor wafer illustrating the step of forming cup-shape structures.

Referring to FIG. 5, an etching process is introduced to remove the filling material 36 and the etched dielectric layer 26. The filling material 36 and the dielectric layer 26 can be removed at the same time if both of the structures are formed by the same material. For example, in the case of both materials being oxide, they can be simultaneously etched by using HF or BOE. The resulting structure is shown in FIG. 5 with the cup-shape structure serving as first storage node for the capacitor.

Figure 6:
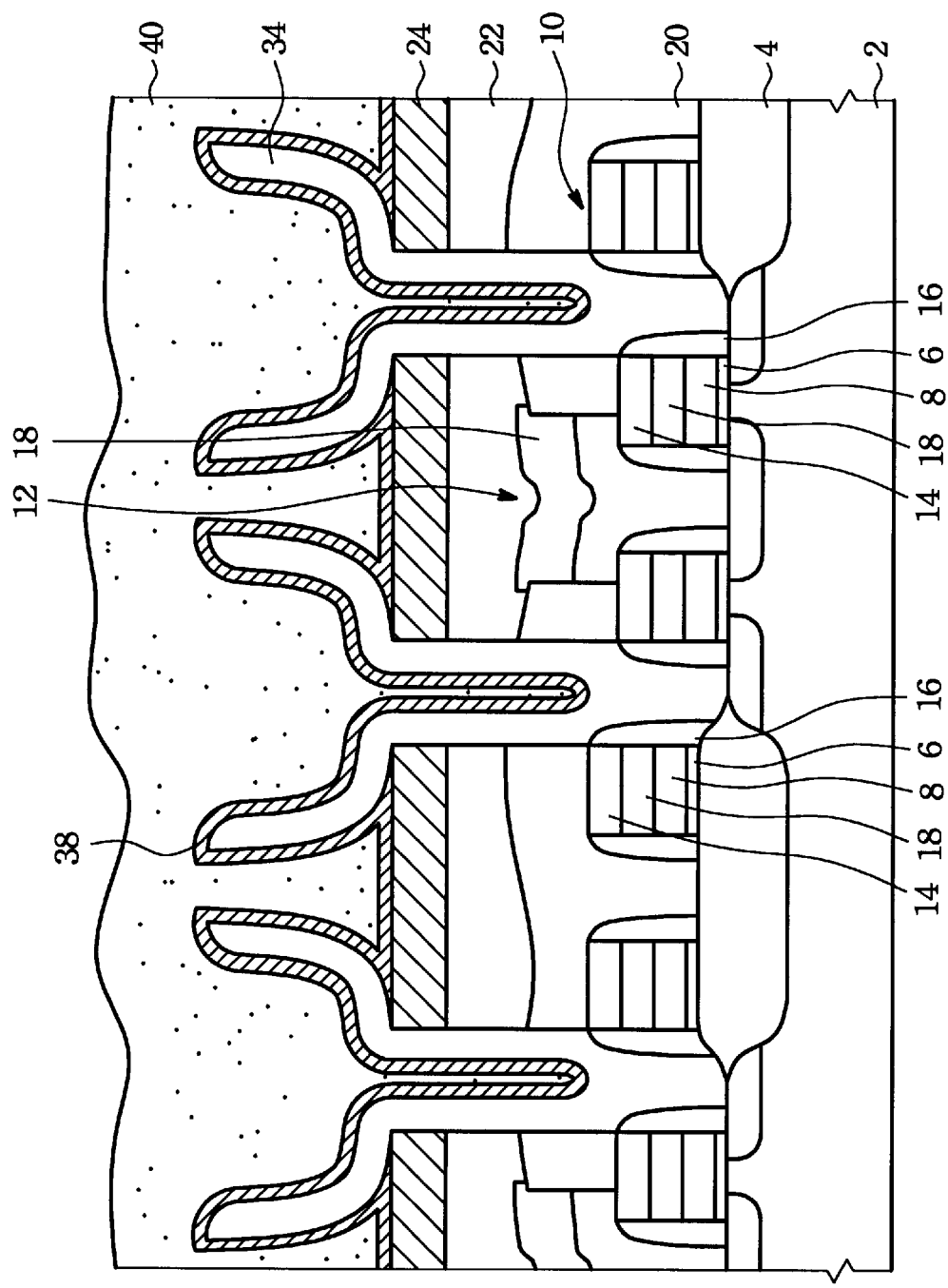
FIG. 6 is a cross section view of a semiconductor wafer illustrating the steps of forming a dielectric film on the conductive layer and forming a further conductive layer on the dielectric film.

Turning next to FIG. 6, the next step is the deposition of a dielectric film 38 along the surface of the first storage node 34. The dielectric film 38 is preferably formed of either a double film of nitride/oxide film, a triple film of oxide/nitride/oxide, or any other high dielectric film such as tantalum oxide (Ta2O5) or BST. Finally, a third conductive layer 40 is deposited using well known process over the dielectric film 38. The third conductive layer 40 is used as the second storage electrode and is formed of doped polysilicon, in-situ doped polysilicon, aluminum, copper, tungsten or titanium compound. Thus, a semiconductor capacitor comprising the second storage electrode 40, a dielectric 38, and the first storage electrode 34 is formed.

The present invention thus provides capacitors with an enlarged surface area. The present invention uses the high etching selectivity between nitride and oxide to fabricate the capacitor. Moreover, the cup-shape structure increases the surface area of the capacitor. Therefore the present invention increases the performance of the capacitor. As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor, the method comprising the steps of:

sequentially forming a first oxide layer and a second oxide layer on a semiconductor substrate;

forming an etching stop layer on said second oxide layer over said semiconductor substrate;

forming a dielectric layer on said etching stop layer, wherein said dielectric layer has a higher etching selectivity to said etching stop layer;

patterning a photoresist on said dielectric layer;

anisotropically etching said dielectric layer by using said photoresist as an etching mask, thereby generating a slot in said dielectric layer;

isotropically etching said dielectric layer by using said photoresist as an etching mask, thereby expanding said slot to form a cup-shape cavity in said dielectric layer;

anisotropically etching said first and said second oxide layers, thereby expanding said cup-shape cavity to create a contact hole in said first and said second oxide layers;

stripping said photoresist;

forming a first conductive layer along and substantially conforming to the surface of said etched dielectric layer and said etched first and second oxide layers;

filling material into said contact hole and said cup-shape cavity so as to cover said cup-shape cavity's entire surface wherein an upper portion of said first conductive layer is left exposed by said material;

removing the exposed upper portion of said first conductive layer using said material as a mask;

removing said etched dielectric layer and said material to generate a conductive structure;

forming a dielectric film on said conductive; and forming a second conductive layer over said dielectric film.

2. The method of claim 1, wherein said dielectric layer comprises oxide.

3. The method of claim 1 wherein said etching stop layer comprises nitride.

4. The method of claim 1, wherein said material for filling comprises oxide.

5. The method of claim 1, wherein said material for filling comprises polyimide.

6. The method of claim 1, wherein said material for filling comprises photoresist.

7. The method of claim 1, wherein said first conductive layer and said second conductive layer are selected from the group of doped polysilicon or in-situ doped polysilicon, aluminum, copper, tungsten, and titanium compound.

8. The method of claim 1, wherein said dielectric film is formed of tantalum oxide ($Ta_2O_5$) or BST.

9. The method of claim 1, wherein said dielectric film comprises a triple oxide/nitride/oxide film.

10. The method of claim 1, wherein said dielectric film is formed of a double film of nitride/oxide film.

11. A method for manufacturing a cup-shape silicon structure, the method comprising the steps of:

sequentially forming a first oxide layer and a second oxide layer on a substrate;

forming an etching stop layer on said second oxide layer over said substrate;

forming a dielectric layer on said etching stop layer, wherein said dielectric layer has a higher etching selectivity than said etching stop layer;

patterning a photoresist on said dielectric layer;

anisotropically etching said dielectric layer by using said photoresist as an etching mask, thereby generating a slot in said dielectric layer;

isotropically etching said dielectric layer by using said photoresist as an etching mask, thereby expanding said slot to form a cup-shape cavity in said dielectric layer;

anisotropically etching said first and said second oxide layers, thereby expanding said cup-shaped cavity to create a contact hole in said first and said second oxide layers;

stripping said photoresist;

forming a silicon layer along and substantially conforming to the surface of said etched dielectric layer and said etched first and second oxide layers;

filling material into said contact hole and said cup-shape cavity so as to cover said cup-shape cavity's entire surface, wherein an upper portion of said silicon layer is left exposed by said material;

removing said upper portion of said silicon layer using said material as a mask; and removing said dielectric layer and said material to generate said silicon structure.

12. The method of claim 11, wherein said dielectric layer comprises oxide.

13. The method of claim 11, wherein said anisotropical etching comprises dry etching.

14. The method of claim 11, wherein said etching stop layer comprises nitride.

15. The method of claim 11, wherein said material for filling comprises oxide.

16. The method of claim 11, wherein said material for filling comprises polyimide.

17. The method of claim 11, wherein said material for filling comprises photoresist.

18. The method of claim 11, wherein said silicon layer is selected from the group of doped polysilicon and in-situ doped polysilicon, aluminum, copper, tungsten, and titanium compound.

19. The method of claim 1, wherein the first and the second oxide layers are formed to a collective thickness of about 1000–10000 angstroms.

20. The method of claim 11, wherein the first and the second oxide layers are formed to a collective thickness of about 1000–10000 angstroms.

* * * * *

UNITED STATES PATENT AND TRADEMARK OFFICE
CERTIFICATE OF CORRECTION

PATENT NO.    : 6,251,742 B1
DATED         : June 26, 2001
INVENTOR(S)   : Y.-S. Lin It is certified that error appears in the above-identified patent and that said Letters Patent is hereby corrected as shown below:

Title page,
Item [56], References Cited, U.S. PATENTS DOCUMENTS, "Kohl et al." should read -- Koh et al. --

Column 5,
Line 46, "conductive; and" should read -- conductive structure; and --

Signed and Sealed this

Eighteenth Day of June, 2002

*Attest:*

JAMES E. ROGAN
*Attesting Officer*              *Director of the United States Patent and Trademark Office*